(12) United States Patent
Lin et al.

(10) Patent No.: US 9,105,685 B2
(45) Date of Patent: Aug. 11, 2015

(54) METHOD OF FORMING SHALLOW TRENCH ISOLATION STRUCTURE

(71) Applicant: United Microelectronics Corp., Hsinchu (TW)

(72) Inventors: Chien-Ting Lin, Hsinchu (TW); Shih-Hung Tsai, Tainan (TW); Chun-Hsien Lin, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 145 days.

(21) Appl. No.: 13/941,208

(22) Filed: Jul. 12, 2013

(65) Prior Publication Data

US 2015/0017781 A1    Jan. 15, 2015

(51) Int. Cl.
*H01L 21/762*     (2006.01)
*H01L 21/308*     (2006.01)
*H01L 21/8238*    (2006.01)
*H01L 21/84*      (2006.01)
*H01L 21/8234*    (2006.01)

(52) U.S. Cl.
CPC ........ *H01L 21/76224* (2013.01); *H01L 21/308* (2013.01); *H01L 21/823431* (2013.01); *H01L 21/823821* (2013.01); *H01L 21/845* (2013.01)

(58) Field of Classification Search
CPC ............ H01L 21/76224; H01L 21/308; H01L 21/823431; H01L 21/823821; H01L 21/845
See application file for complete search history.

(56) References Cited

U.S. PATENT DOCUMENTS

| 6,043,138 | A | 3/2000 | Ibok |
|---|---|---|---|
| 6,492,216 | B1 | 12/2002 | Yeo et al. |
| 6,921,963 | B2 | 7/2005 | Krivokapic et al. |
| 7,087,477 | B2 | 8/2006 | Fried et al. |
| 7,091,551 | B1 | 8/2006 | Anderson et al. |
| 7,247,887 | B2 | 7/2007 | King et al. |
| 7,250,658 | B2 | 7/2007 | Doris et al. |
| 7,309,626 | B2 | 12/2007 | Ieong et al. |
| 7,352,034 | B2 | 4/2008 | Booth, Jr. et al. |
| 7,470,570 | B2 | 12/2008 | Beintner et al. |
| 7,531,437 | B2 | 5/2009 | Brask et al. |
| 7,569,857 | B2 | 8/2009 | Simon et al. |
| 2004/0195624 | A1 | 10/2004 | Liu et al. |
| 2005/0051825 | A1 | 3/2005 | Fujiwara et al. |
| 2006/0099830 | A1 | 5/2006 | Walther et al. |
| 2006/0286729 | A1 | 12/2006 | Kavalieros et al. |
| 2007/0108528 | A1 | 5/2007 | Anderson et al. |
| 2007/0158756 | A1 | 7/2007 | Dreeskornfeld et al. |
| 2008/0157208 | A1 | 7/2008 | Fischer et al. |
| 2009/0124097 | A1 | 5/2009 | Cheng |
| 2009/0242964 | A1 | 10/2009 | Akil et al. |
| 2009/0269916 | A1 | 10/2009 | Kang et al. |
| 2010/0048027 | A1 | 2/2010 | Cheng et al. |
| 2010/0072553 | A1 | 3/2010 | Xu et al. |
| 2010/0144121 | A1 | 6/2010 | Chang et al. |
| 2010/0167506 | A1 | 7/2010 | Lin et al. |
| 2014/0203376 | A1* | 7/2014 | Xie et al. ...................... 257/401 |

* cited by examiner

*Primary Examiner* — Bac Au
*Assistant Examiner* — Toniae Thomas
(74) *Attorney, Agent, or Firm* — J.C. Patents (57) ABSTRACT

A method of forming a shallow trench isolation structure is disclosed. Hard mask patterns are formed on a substrate. A portion of the substrate is removed, using the hard mask patterns as a mask, to form first trenches in the substrate, wherein a fin is disposed between the neighboring first trenches. A filling layer is formed in the first trenches. A patterned mask layer is formed on the filling layer. A portion of the filling layer and a portion of the fins are removed, using the patterned mask layer as a mask, to form second trenches in the substrate. A first insulating layer is formed on the substrate filling in the second trenches.

18 Claims, 10 Drawing Sheets

METHOD OF FORMING SHALLOW TRENCH ISOLATION STRUCTURE

BACKGROUND OF THE INVENTION

1. Field of Invention

The present invention relates to a semiconductor process, and more particularly to a method of forming a shallow trench isolation structure.

2. Description of Related Art

As the device dimension continues to shrink and the level of integration continues to increase, a structure for isolating devices is required to reduce accordingly. Since a shallow trench isolation (STI) structure is scalable without causing any bird's beak encroachment problem as in the conventional local oxidation of silicon (LOCOS) process, it is the preferred isolation technique for a sub-micron (or smaller dimension) metal-oxide-semiconductor fabrication process.

In addition, the required depths of isolation structures are varied according to different applications in the same chip. For example, in a fin-type field effect transistor (FinFET) device, the depth of a STI structure for fins may be different from that for well regions. However, it has been difficult and complicated to fabricate such dual isolation structures having different depths.

SUMMARY OF THE INVENTION

Accordingly, the present invention provides a method of forming a shallow trench isolation structure, which successfully integrates the dual isolation structures into the existing CMOS process.

The present invention provides a method of forming a shallow trench isolation structure. A plurality of hard mask patterns is formed on a substrate. A portion of the substrate is removed by using the hard mask patterns as a mask, so as to form a plurality of first trenches in the substrate, wherein a fin is disposed between the neighboring first trenches. A filling layer is formed in the first trenches. A patterned mask layer is formed on the filling layer. A portion of the filling layer and a portion of the fins are removed by using the patterned mask layer as a mask, so as to form a plurality of second trenches in the substrate. A first insulating layer is formed on the substrate filling in the second trenches.

According to an embodiment of the present invention, a width of the second trenches is greater than a width of the first trenches.

According to an embodiment of the present invention, the filling layer is a second insulating layer, and the first insulating layer has a material harder than a material of the second insulating layer.

According to an embodiment of the present invention, the first insulating layer is formed by a high-density-plasma CVD process, and the second insulating layer is formed by a flowable CVD process or a spin-coating process.

According to an embodiment of the present invention, the method further includes performing a first planarization step to the first insulating layer and the filling layer until tops of the hard mask patterns are exposed, and etching back the first insulating layer until upper portions of the remaining fins are exposed.

According to an embodiment of the present invention, the first planarization step includes a performing chemical mechanical polishing process.

According to an embodiment of the present invention, the method further includes, after the step of forming the filling layer and before the step of forming the patterned mask layer, performing a second planarization step to planarize the filling layer until the tops of the hard mask patterns are exposed.

According to an embodiment of the present invention, the second planarization step includes performing a chemical mechanical polishing process.

According to an embodiment of the present invention, the filling layer is a spin-coated organic dielectric layer.

According to an embodiment of the present invention, the method further includes removing the filling layer before the step of forming the first insulating layer, wherein the first insulating layer further fills in the first trenches.

According to an embodiment of the present invention, the method further includes performing a first planarization step to the first insulating layer until tops of the hard mask patterns are exposed, and etching back the first insulating layer until upper portions of the remaining fins are exposed.

According to an embodiment of the present invention, the first planarization step comprises a performing chemical mechanical polishing process.

According to an embodiment of the present invention, a depth of the second trenches is greater than a depth of the first trenches.

According to an embodiment of the present invention, a depth of the second trenches is substantially the same as a depth of the first trenches.

According to an embodiment of the present invention, the step of forming the hard mask patterns includes the following steps. A hard mask layer and a sacrificial layer are sequentially formed on the substrate. The sacrificial layer is patterned to form a plurality of mandrel patterns. A spacer is formed on a sidewall of each mandrel pattern. The mandrel patterns are removed. The hard mask layer is patterned by using the spacers as a mask.

According to an embodiment of the present invention, the hard mask layer includes, form bottom o top, a first silicon oxide layer, a silicon nitride layer, and a second silicon oxide layer. Beside, the spacers include silicon nitride, and the sacrificial layer includes amorphous silicon.

According to an embodiment of the present invention, the step of removing the portion of the filling layer and the portion of the fins further includes breaking loops of the fins.

According to an embodiment of the present invention, the method further includes forming a bottom anti-reflection coating (BARC) layer on the filling layer before the step of forming the patterned mask layer.

According to an embodiment of the present invention, the patterned mask layer includes photoresist, silicon oxide, silicon nitride or a combination thereof.

According to an embodiment of the present invention, the first insulating layer includes silicon oxide.

In view of the above, with the method of the invention, it is easy and simple to integrate the dual isolation structures having different depths into the existing CMOS process, thereby achieving competitive advantages over competitors.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2B-1 is a schematic cross-sectional view illustrating a step of a method of forming a shallow trench isolation structure according to an embodiment of the present invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

First Embodiment

FIG. 1A to FIG. 1J are schematic cross-sectional views illustrating a method of forming a shallow trench isolation structure according to a first embodiment of the present invention. It is noted that each of FIG. 1D to FIG. 1F has two parts in the drawing, the lower part illustrates a cross-sectional view, and the upper part illustrates a top view. For clarity and convenience of illustration, some components are omitted from the top views in FIG. 1D to FIG. 1F.

Figure 1A:
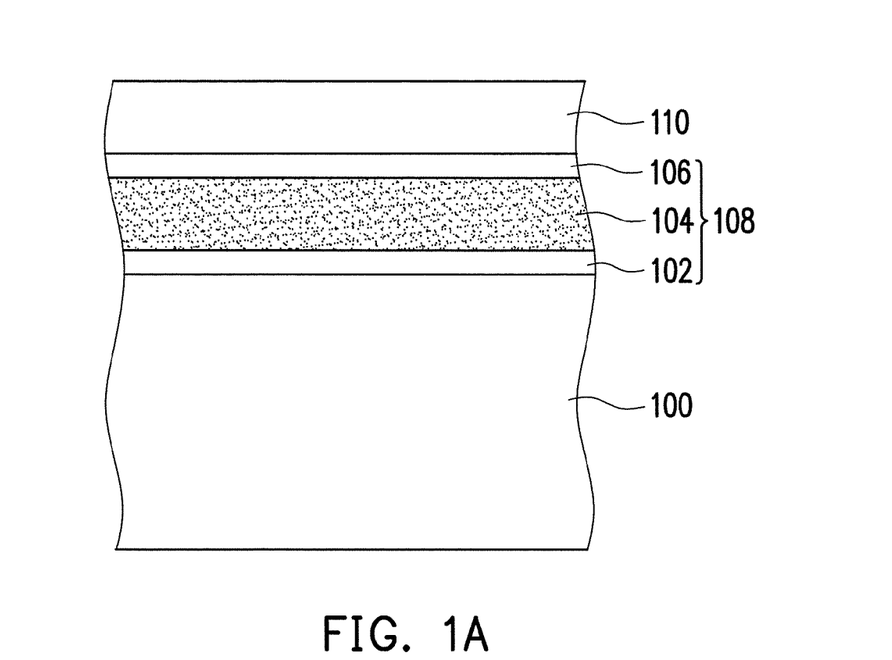
FIG. 1A to FIG. 1J are schematic cross-sectional views illustrating a method of forming a shallow trench isolation structure according to a first embodiment of the present invention.

Referring to FIG. 1A, a hard mask layer 108 and a sacrificial layer 110 are sequentially formed on the substrate 100. The substrate 100 can be a semiconductor substrate, such as a silicon-containing substrate. The hard mask layer 108 can be a single layer or a multi-layer structure. In this embodiment, the hard mask layer 108 includes, from bottom to top, a first oxide layer 102, a nitride layer 104 and a second oxide layer 106. The first oxide layer 102 includes silicon oxide. The nitride layer 104 includes silicon nitride. The second oxide layer 106 includes silicon oxide. The sacrificial layer 110 can be an amorphous silicon layer, a polysilicon layer or a material layer having an etching selectivity different from that of the underlying hard mask layer 108. In this embodiment, the sacrificial layer 110 includes an amorphous silicon layer. The method of forming each of the first oxide layer 102, the nitride layer 104, the second oxide layer 106 and the sacrificial layer 110 includes performing a chemical vapour deposition (CVD) process or a suitable deposition process.

Figure 1B:
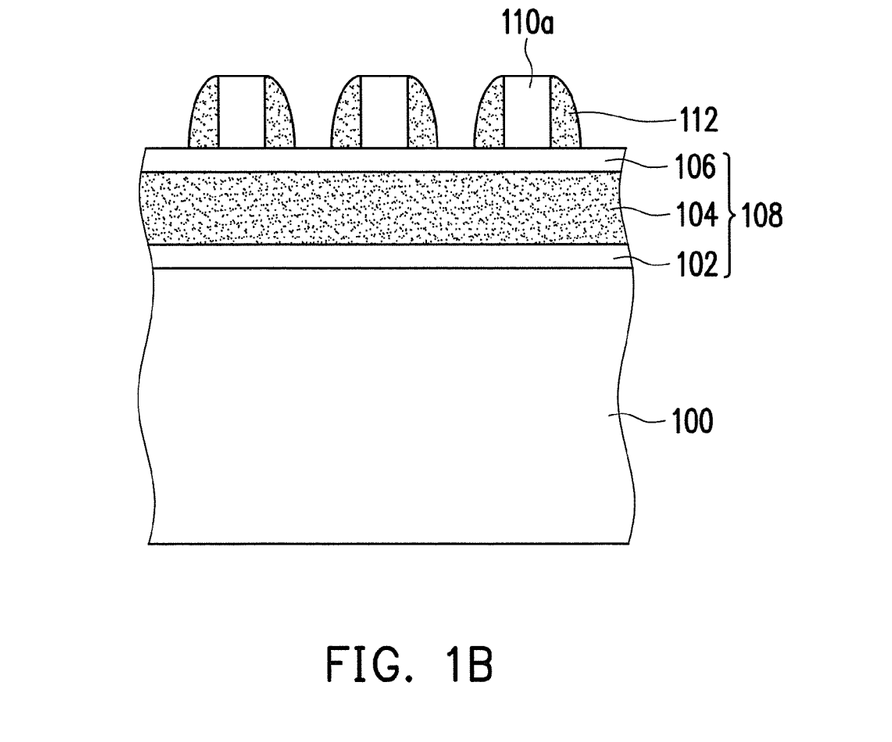

Referring to FIG. 1B, the sacrificial layer 110 is patterned to form a plurality of mandrel patterns (or called core patterns) 110a. The patterning step includes performing photolithography and etching processes. Thereafter, a spacer 112 is formed on the sidewall of each mandrel pattern 110a. The spacers 112 include silicon nitride. The method of forming the spacers 112 includes forming a spacer material layer on the substrate 100 covering the mandrel patterns 110a, and then performing an anisotropic dry etching process to remove a portion of the spacer material layer. In an embodiment, from a top view, each of the spacers 112 is shaped in a loop surrounding the corresponding mandrel pattern 110a. Afterwards, the mandrel patterns 110a are removed through an etching process.

Figure 1C:
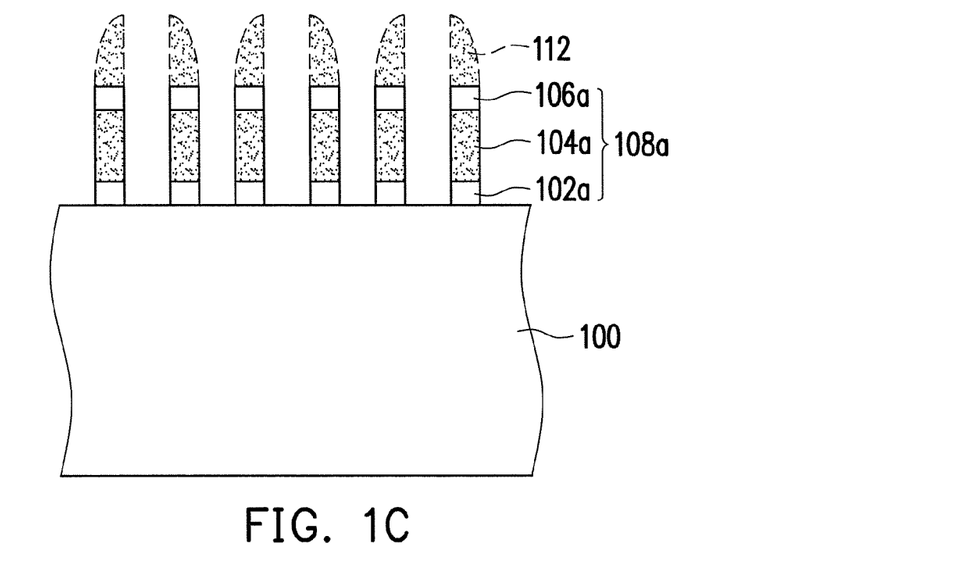

Referring to FIG. 1C, the hard mask layer 108 is patterned to form a plurality of hard mask patterns 108a on the substrate 100. In this embodiment, each hard mask pattern 108a includes, from bottom to top, a first oxide pattern 102a, a nitride pattern 104a and a second oxide pattern 106a. The patterning step includes performing a dry etching process by using the spacers 112 as a mask. The spacers 112 may be simultaneously removed during the said dry etching process or removed through another etching process.

Figure 1D:
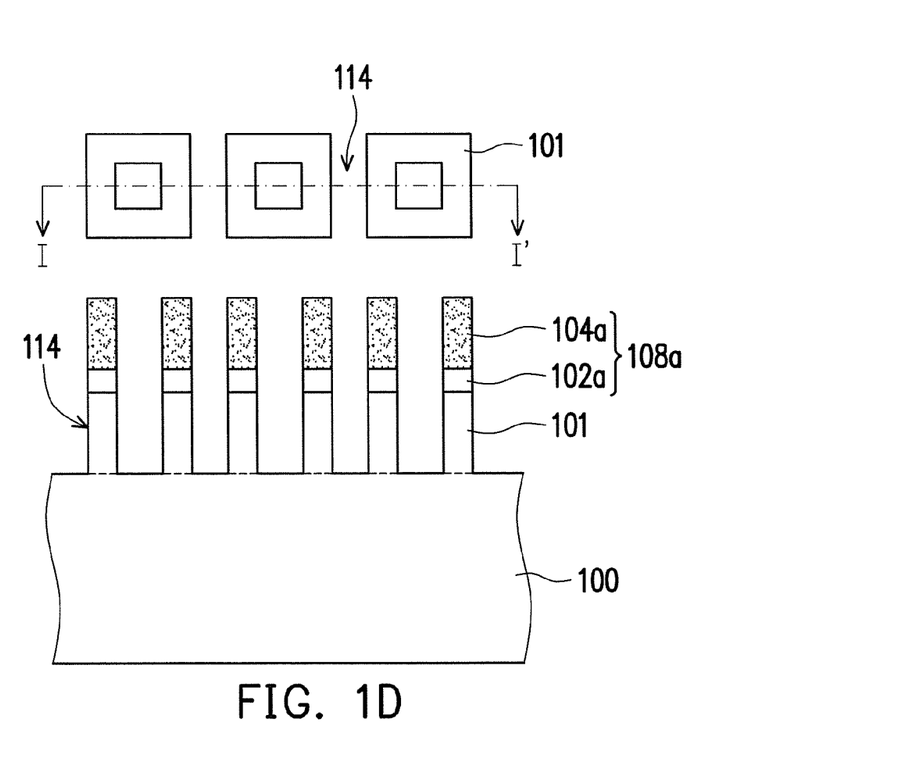

Referring to FIG. 1D, a portion of the substrate 100 is removed by using the hard mask patterns 108a as a mask, so as to form a plurality of first trenches 114 in the substrate 100, and a fin 101 is disposed between the neighboring first trenches 114. The removing step includes performing a dry etching process, and the second oxide pattern 106a of each hard mask pattern 108a may be simultaneously removed during the said removing step. In this embodiment, since the second oxide patterns 106a are removed from the hard mask patterns 108a, hereinafter, the hard mask patterns 108a are marked to include the first oxide patterns 102a and the nitride patterns 104a.

Specifically, the substrate 100 is patterned to have the first trenches 114 and the fins 101 alternately arranged therein, as shown in the lower part of FIG. 1D being a cross-sectional view. However, as shown in the upper part of FIG. 1D being a top view, from left to right, the first and second fins 101 form a first loop, the third and fourth fins 101 form a second loop, the fifth and sixth fins 101 form a third loop, and otherwise unspecified regions are first trenches 114. In FIG. 1D, the substrate 100 is formed with a few of fin loops. However, practically, the substrate 100 can be formed with hundreds or thousands of fin loops. Besides, the first trenches 114 may have same or different widths upon the design requirements.

As shown in FIG. 1C to FIG. 1D, the fins 101 of the device are fabricated by using the hard mask patterns 108a as a mask, and thus the fin-defining step can be regarded as a self-aligned process. Such self-aligned process can provide better fin width control and therefore improve the performance of the device.

Figure 1E:
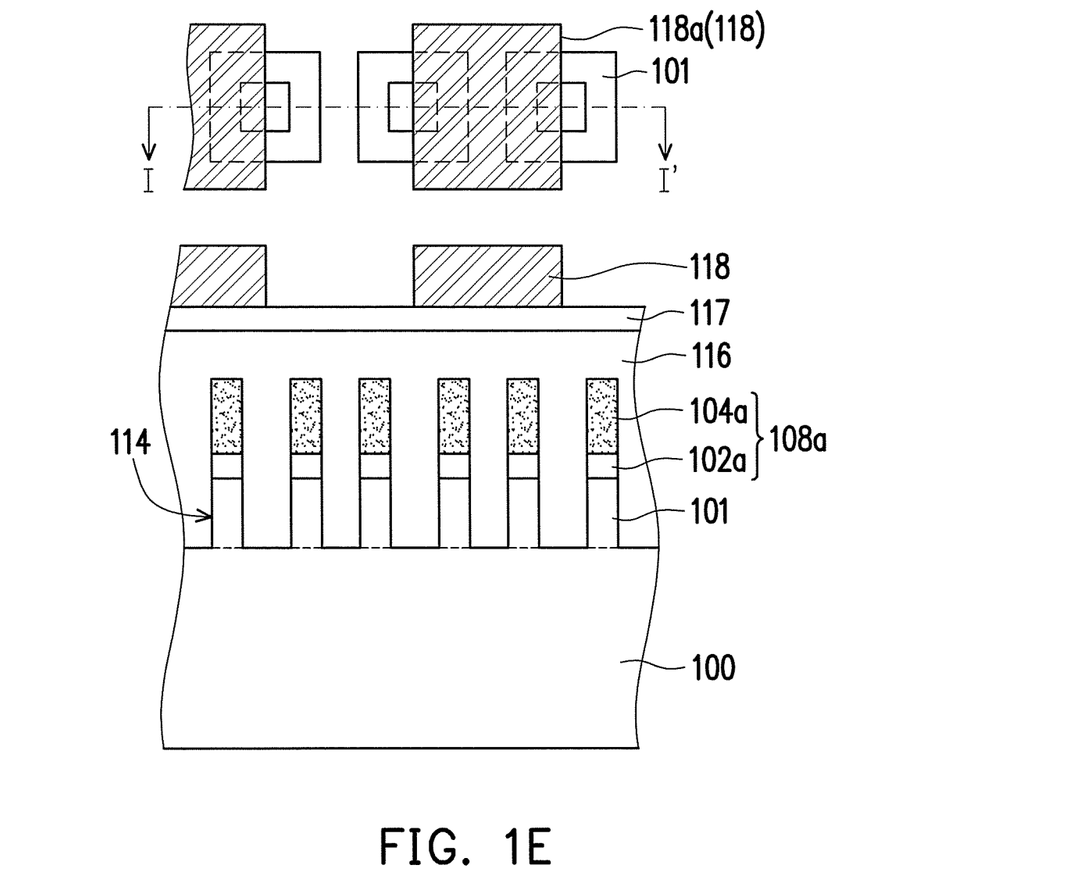

Referring to FIG. 1E, a filling layer 116 is formed in the first trenches 114. In this embodiment, the filling layer 116 can be an organic dielectric layer, such as a spin-coated organic dielectric layer. The organic dielectric layer as a filling layer 116 can be blanket-formed on the substrate 100 filling in the first trenches 114 through a spin-coating process.

Thereafter, a patterned mask layer 118 is formed on the filling layer 116. The patterned mask layer 118 can be a single layer or a multi-layer structure. In an embodiment, the patterned mask layer 118 is formed to have a plurality of islands 118a, and each island 118a covers a portion of the corresponding fin loop(s), as shown in the upper part of FIG. 1E being a top view. In an embodiment, when the patterned mask layer 118 is a photoresist layer, a bottom anti-reflection coating (BARC) layer 117 can be optionally formed on the filling layer 116 before the formation of the photoresist layer. The BARC layer 117 not only provides a planar surface for the subsequently formed photoresist layer, but also suppresses the standing wave effect and reflective notching of the photoresist layer. The BARC layer 117 usually includes an organic material compatible with the photoresist layer. In another embodiment, the patterned mask layer 118 can include silicon oxide, silicon nitride layer or a combination thereof, and the forming method thereof can include depositing a mask layer on a substrate and then patterning the mask layer.

Figure 1F:
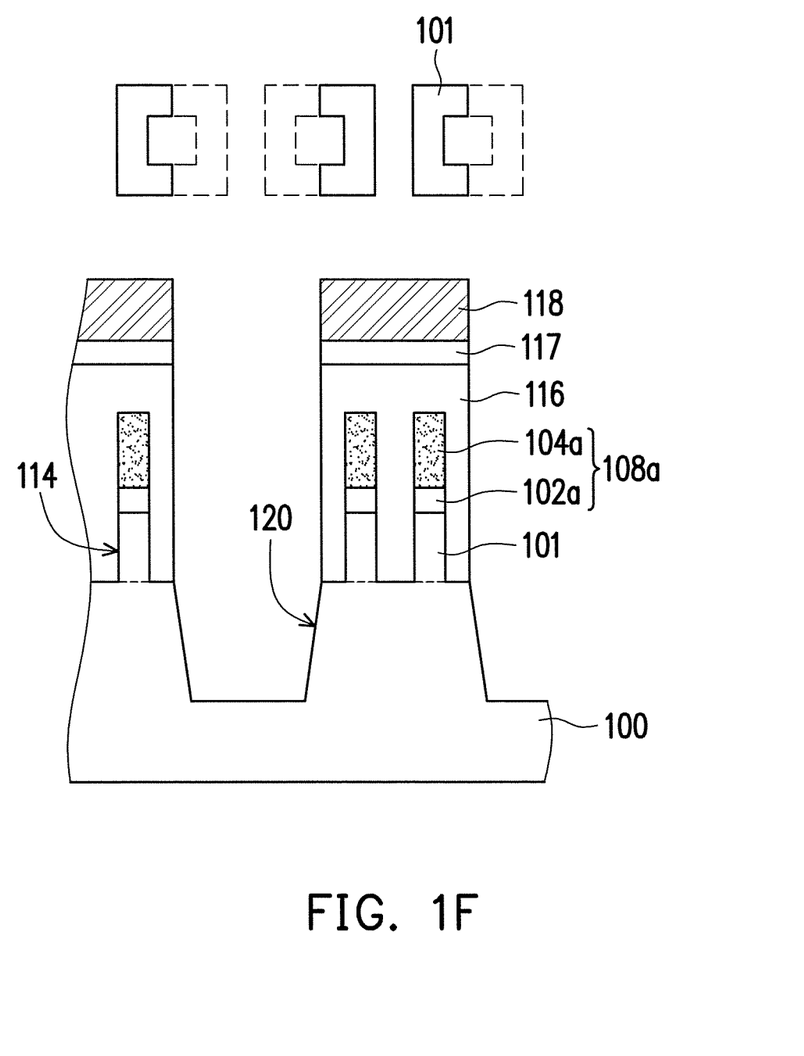

Referring to FIG. 1F, a portion of the filling layer 116 and a portion of the fins 101 are removed by using the patterned mask layer 118 as a mask, so as to form a plurality of second trenches 120 in the substrate 100. The removing step includes performing a dry etching process. Besides, a portion of the first oxide patterns 102a and a portion of the nitride patterns 104a can be simultaneously removed and the BARC layer 117 can be simultaneously patterned during the said removing step.

It is noted that the said removing step further includes breaking loops of the fins 101 (or called a fin cut process). In other words, the patterns for defining the second trenches 120 can be embedded into the photomask for breaking loops of the fins 101. Therefore, only one photomask is used to achieve the purpose of reducing the process cost.

In an embodiment, the bottom of each second trench 120 is lower than that of each first trench 114, as shown in FIG. 1F. However, the present invention is not limited thereto. In another embodiment (not shown), the bottom of each second trench 120 can be substantially the same as that of each first trench 114.

Besides, the second trenches 120 may have same or different widths upon the design requirements. In an embodiment, the second trenches 120 have a width greater than that of the first trenches 114, as shown in FIG. 1F. However, the present invention is not limited thereto. In another embodiment (not shown), the width of the second trenches 120 can be substantially the same or smaller than that of the first trenches 114.

Figure 1G:
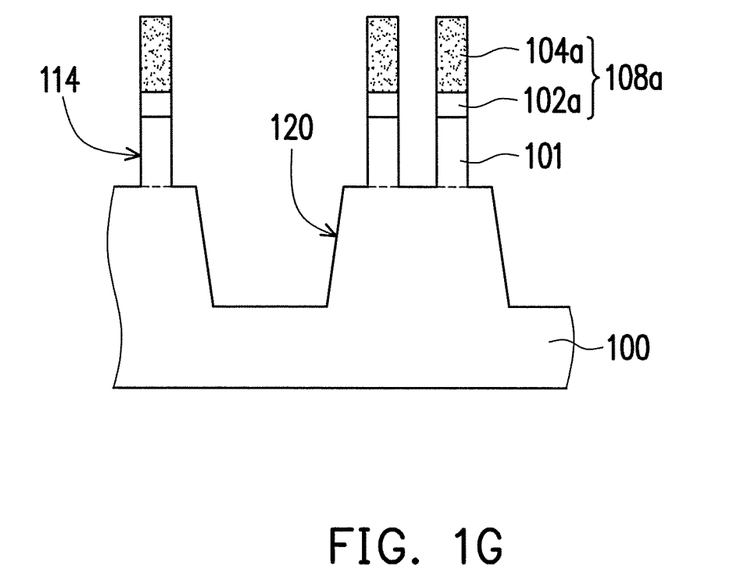

Referring to FIG. 1G, the patterned mask layer 118 and the remaining BARC layer 117 are removed through an etching process. Thereafter, the remaining filling layer 116 is removed through another etching process. In this embodiment, since the filling layer 116 has been totally removed, it can be regarded as a sacrificial layer.

Figure 1H:
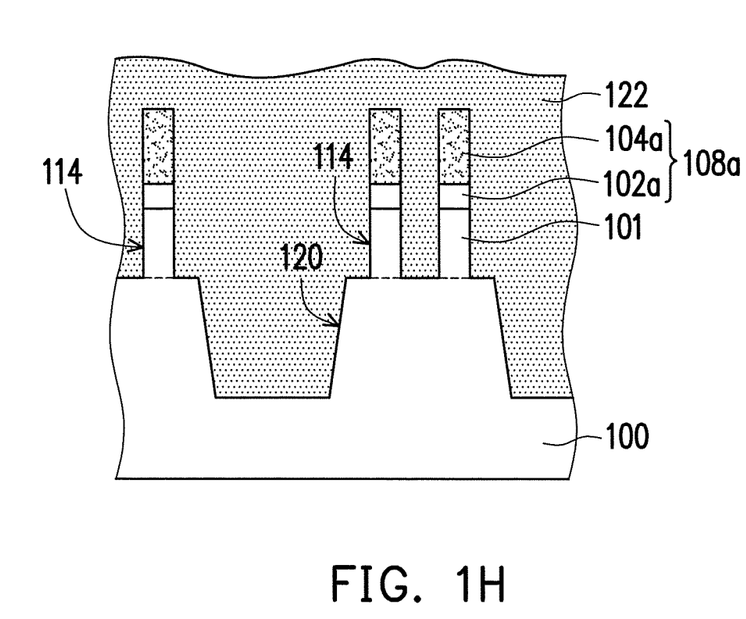

Referring to FIG. 1H, an insulating layer 122 is formed on the substrate 100 filling in the first trenches 114 and the second trenches 120. The insulating layer 122 includes silicon oxide or a suitable dielectric material, and the forming method thereof includes performing a CVD process or a suitable deposition process.

Figure 1I:
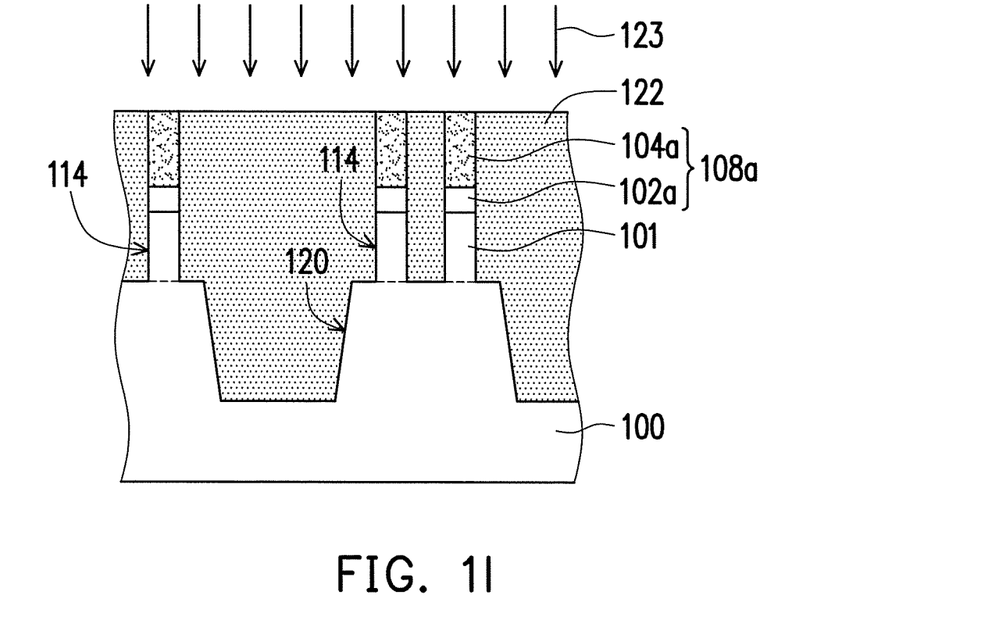

Referring to FIG. 1I, a planarization step 123 is performed to the insulating layer 122 until tops of the hard mask patterns 108a (or the nitride patterns 104a) are exposed. The planarization step 123 includes performing a chemical mechanical polishing (CMP) process by using the hard mask patterns 108a (or the nitride patterns 104a) as a polishing stop layer.

Figure 1J:
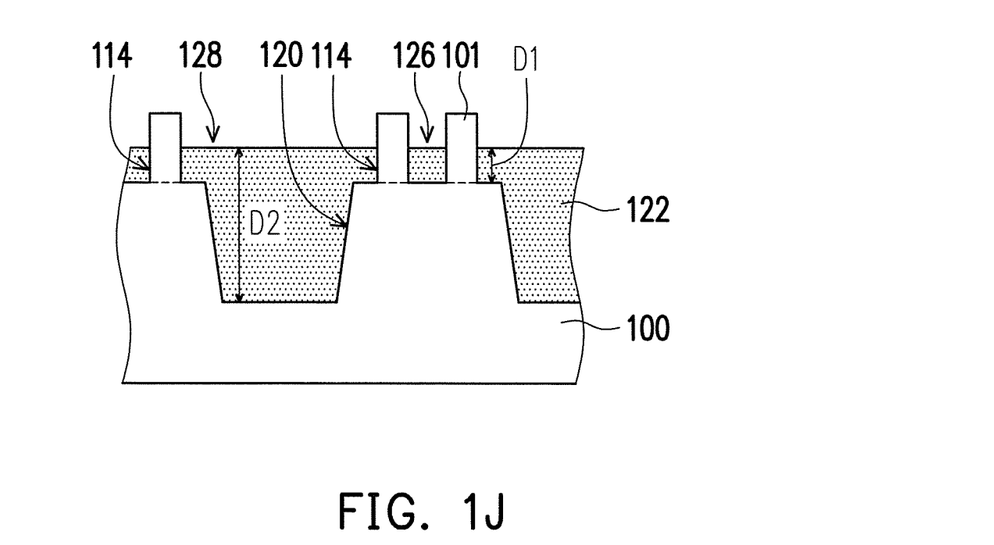

Referring to FIG. 1J, the insulating layer 122 is etched back until upper portions of the remaining fins 101 are exposed. The hard mask patterns 108a can be simultaneously removed during the etching back step. As a result, in an embodiment, the insulating layer 122 left in the first trenches 114 serves as STI structures 126 for fin isolation, while the insulating layer 122 left in the second trenches 120 serves as STI structures 128 for well isolation. As shown in FIG. 1J, the STI structures 128 for well isolation have a depth D2 greater than the depth D1 of the STI structures 126 for fin isolation. For examples, the depth D2 ranges from 1500 to 2500 angstroms, such as 2,000 angstroms. The depth D1 ranges from 500 to 1300 angstroms, such as 1,000 angstroms. However, the present invention is not limited thereto. In another embodiment (not shown), the depth D2 of the STI structures 128 for well isolation can be substantially the same as the depth D1 of the STI structures 126 for fin isolation.

Second Embodiment

FIG. 2A to FIG. 2G are schematic cross-sectional views illustrating a method of forming a shallow trench isolation structure according to a second embodiment of the present invention. The second embodiment is similar to the first embodiment, the difference between them is illustrated in the following, and the similarities are not iterated herein.

Figure 2A:
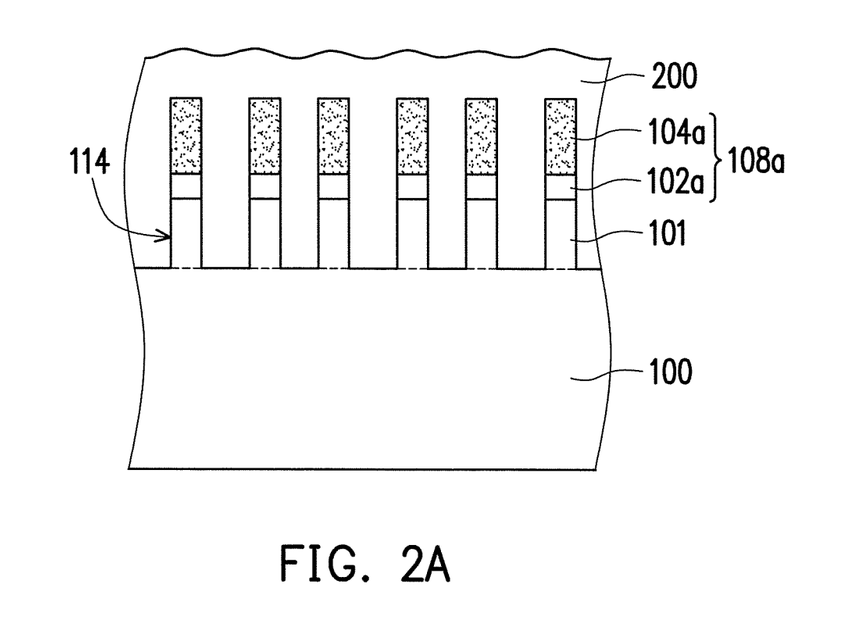
FIG. 2A to FIG. 2F are schematic cross-sectional views illustrating a method of forming a shallow trench isolation structure according to a second embodiment of the present invention.

Referring to FIG. 2A, first, the intermediate structure of FIG. 1D is provided. A filling layer 200 is formed in the first trenches 114. The insulating layer as a filling layer 200 can be blanket-formed on the substrate 100 filling in the first trenches 114 through a suitable deposition (FCVD) or spin-coating process. In an embodiment, the filling layer 200 can be an insulating layer including silicon oxide or a suitable dielectric material formed through a CVD process. In another embodiment, the filling layer 200 can be a softer insulating layer or a spin-on dielectric (SOD) material to have a substantially planar top surface.

Figure 2B:
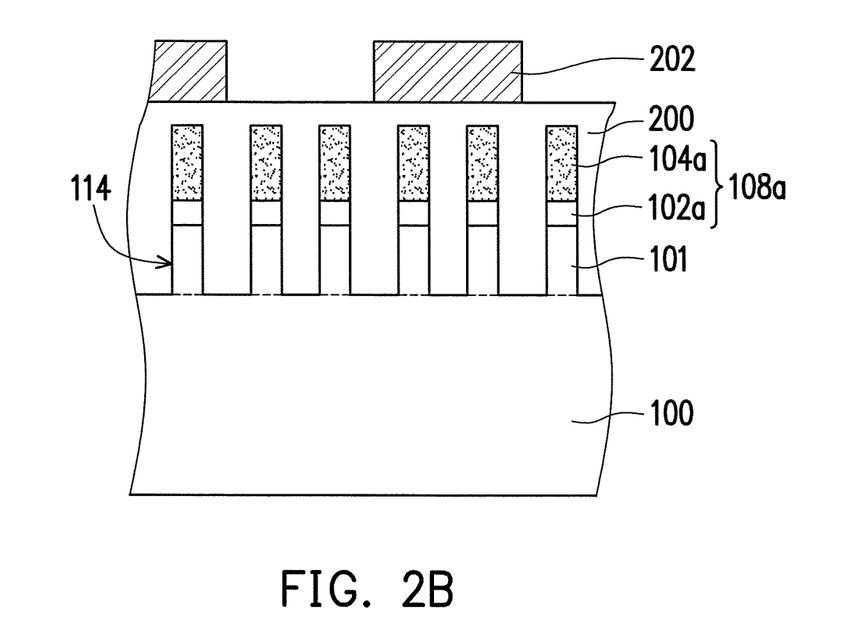

Referring to FIG. 2B, if the insulating filling layer 200 is formed to have the substantially planar top surface, a planarization step is not required to perform thereon. In such case, a patterned mask layer 202 can be formed on the filling layer 200 after the formation of the filling layer 200. Similar to the patterned mask layer 118 in FIG. 1E, the patterned mask layer 202 can be a single layer or a multi-layer structure. In an embodiment, the patterned mask layer 202 is formed to have a plurality of islands, and each island covers a portion of the corresponding fin loop(s), as shown in the upper part of FIG. 1E being a top view. In this embodiment, the patterned mask layer 202 covers a portion of the tops of the hard mask patterns 108a while exposes another portion of the tops of the hard mask patterns 108a. The patterned mask layer 202 can include photoresist, silicon oxide, silicon nitride layer or a combination thereof, and the forming method thereof includes performing a spin-coating process, a CVD process or a suitable deposition process.

Figure 2B:
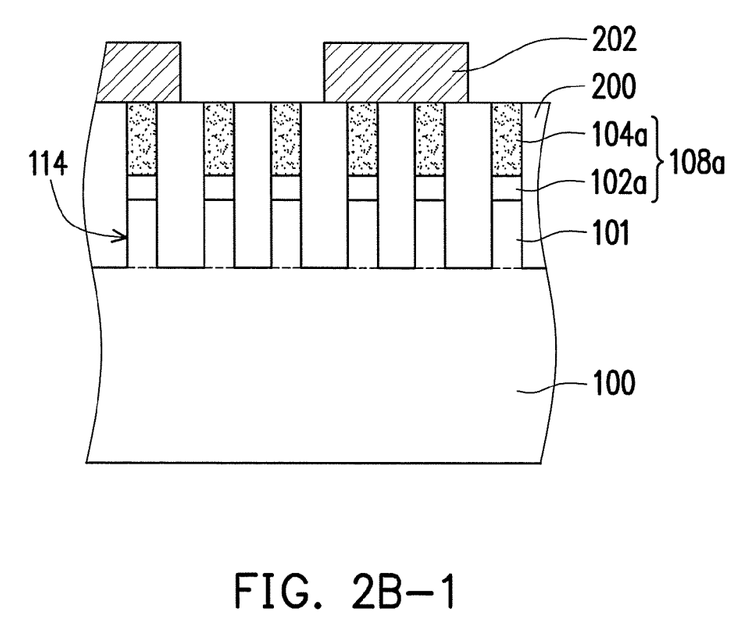

Referring to FIG. 2B-1, if the insulating filling layer 200 is not formed to have a substantially planar top surface, before the patterned mask layer 202 is formed, a planarization step is performed to the insulating layer 200 until tops of the hard mask patterns 108a (or the nitride patterns 104a) are exposed. The planarization step includes performing a CMP process by using the hard mask patterns 108a (or the nitride patterns 104a) as a polishing stop layer.

Figure 2C:
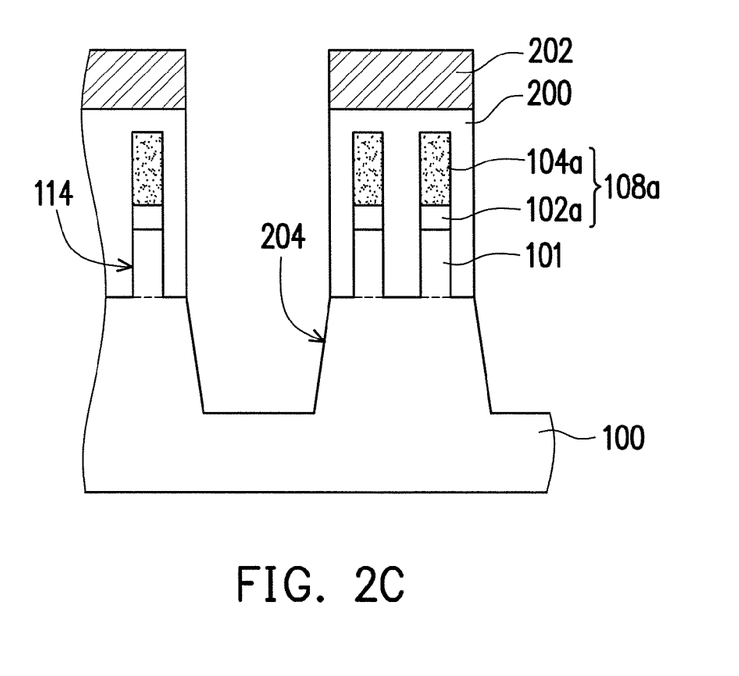

Referring to FIG. 2C, a portion of the filling layer 200 and a portion of the fins 101 are removed by using the patterned mask layer 202 as a mask, so as to form a plurality of second trenches 204 in the substrate 100. The removing step includes performing a dry etching process. Besides, a portion of the first oxide patterns 102a and a portion of the nitride patterns 104a can be simultaneously removed during the said removing step. It is noted that the said removing step further includes breaking loops of the fins 101. Thereafter, the patterned mask layer 202 is removed through an etching process.

The embodiment of FIG. 2C in which the second trenches 204 are deeper and wider than the first trenches 114 is provided for illustration purposes, and is not construed as limiting the present invention. It is appreciated by people having ordinary skill in the art that the second trenches 204 can be as deep as, as wide as or than the first trenches 114 upon the design requirements. Besides, the second trenches 204 may have same or different widths.

Figure 2D:
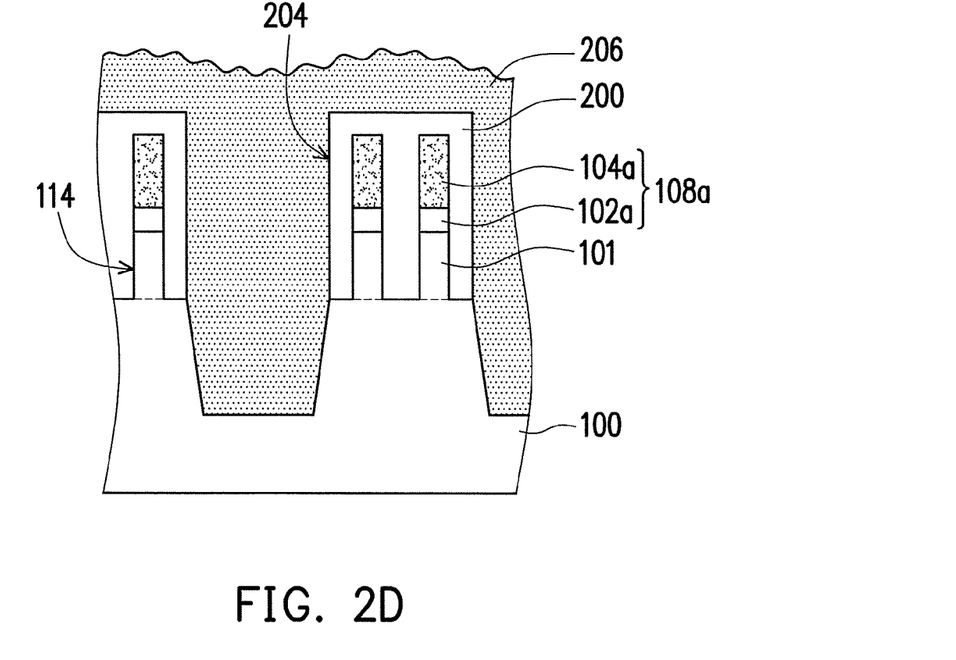

Referring to FIG. 2D, an insulating layer 206 is formed on the substrate 100 filling in the second trenches 204. In an embodiment, the insulating layer 206 includes silicon oxide or a suitable dielectric material, and the forming method thereof includes performing a CVD process or a suitable deposition process. In another embodiment, the insulating layer 206 can be a harder insulating layer formed by a high-density-plasma CVD (HDP-CVD) process. The material of the insulating layer 206 can be the same as or different from that of the insulating filling layer 200. In this embodiment, the insulating layer 206 has a material harder than that of the insulating filling layer 200.

Figure 2E:
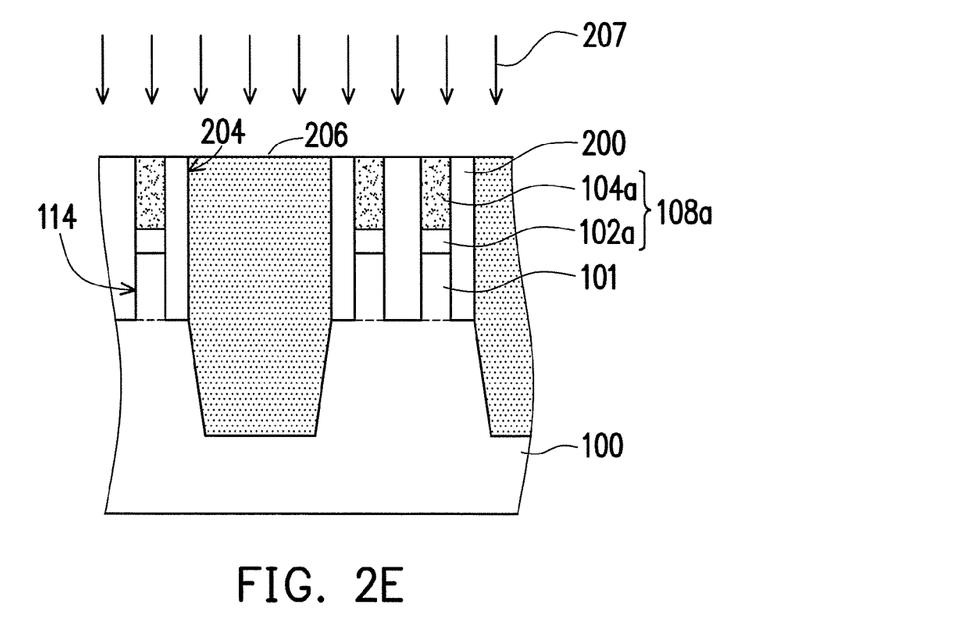
Figure 2F:
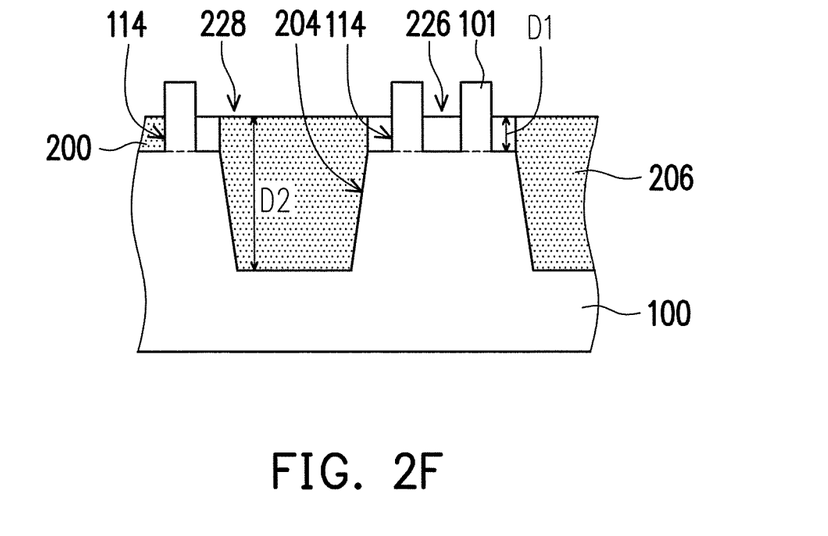

Referring to FIG. 2E, a planarization step 207 is performed to the insulating layer 206 and the insulating filling layer 200 until tops of the hard mask patterns 108a (or the nitride patterns 104a) are exposed. The planarization step 207 includes performing a CMP process by using the hard mask patterns 108a (or the nitride patterns 104a) as a polishing stop layer. In this embodiment, the planarization step 207 is merely performed to the insulating layer 206, as shown in FIG. 2F. However, the present invention is not limited thereto. In another embodiment, if the previous planarization step 201 of FIG. 2B is omitted, the planarization step 207 can be simultaneously performed to the insulating layer 206 and the insulating filling layer 200 until tops of the hard mask patterns 108a (or the nitride patterns 104a) are exposed.

It is noted that the conventional dishing phenomenon in the open area (e.g. the location where the second trenches 204 are formed) during a CMP process (e.g. the planarization step 207) is not observed in the present invention. Specifically, in the present invention, a softer insulating filling layer 200 is formed in the dense area (where the hard mask patterns 108a are formed) and a harder insulating layer 206 is formed in the open area (where the second trenches 204 are formed). The harder insulating layer 206 has a better ability resistant to the planarization step 207 than a soft material, so that the conventional dishing phenomenon in the open area can be avoided and therefore a better planarization performance can be achieved.

Referring to FIG. 2F, the insulating layer 206 and the insulating filling layer 200 are etched back until upper portions of the remaining fins 101 are exposed. The hard mask patterns 108a can be simultaneously removed during the etching back step. As a result, the insulating filling layer 200 left in the first trenches 114 serves as STI structures 226 for fin isolation, while the insulating layer 206 left in the second trenches 204 serves as STI structures for well isolation. The depth D2 of the STI structures 228 for well isolation can be greater than or substantially the same as the depth D1 of the STI structures 226 for fin isolation. The subsequent process steps for forming a FinFET device are known to persons having ordinary skill in the art, and are not iterated herein.

In summary, the dual STI structures having different depths can be easily formed with the method of the invention. Specifically, the deeper STI structures for well isolation and the shallower STI structures for fin isolation can be fabricated without complicated process steps, thereby achieving competitive advantages over competitors. Deeper STI structures can provide better well isolation and therefore improve the performance of the device. Besides, better fin width control is observed because the fins of the device are defined through a self-aligned process.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a shallow trench isolation structure, comprising:
   forming a plurality of hard mask patterns on a substrate;
   removing a portion of the substrate by using the hard mask patterns as a mask, so as to form a plurality of first trenches in the substrate, wherein a fin is disposed between the neighboring first trenches;
   forming a filling layer in the first trenches;
   forming a patterned mask layer on the filling layer;
   removing a portion of the filling layer, and a portion of the fins by using the patterned mask layer as a mask, so as to form a plurality of second trenches in the substrate, wherein the step of removing the portion of the filling layer and the portion of the fins further comprises breaking loops of the fins; and
   forming a first insulating layer on the substrate filling in the second trenches.

2. The method of claim 1, wherein a width of the second trenches is greater than a width of the first trenches.

3. The method of claim 2, wherein the filling layer is a second insulating layer, and the first insulating layer has a material harder than a material of the second insulating layer.

4. The method of claim 3, wherein the first insulating layer is formed by a high-density-plasma CVD process, and the second insulating layer is formed by a flowable CVD process or a spin-coating process.

5. The method of claim 3, further comprising:
   performing a first planarization step to the first insulating layer and the filling layer until tops of the hard mask patterns are exposed; and
   etching back the first insulating layer and the filling layer until upper portions of the remaining fins are exposed.

6. The method of claim 5, wherein the first planarization step comprises a performing chemical mechanical polishing process.

7. The method of claim 5, further comprising, after the step of forming the filling layer and before the step of forming the patterned mask layer, performing a second planarization step to planarize the filling layer until the tops of the hard mask patterns are exposed.

8. The method of claim 7, wherein the second planarization step comprises performing a chemical mechanical polishing process.

9. The method of claim 1, wherein the filling layer is a spin-coated organic dielectric layer.

10. The method of claim 9, further comprising removing the filling layer before the step of forming the first insulating layer, wherein the first insulating layer further fills in the first trenches.

11. The method of claim 1, further comprising:
    performing a first planarization step to the first insulating layer until tops of the hard mask patterns are exposed; and
    etching back the first insulating layer until upper portions of the remaining fins are exposed.

12. The method of claim 11, wherein the first planarization step comprises a performing chemical mechanical polishing process.

13. The method of claim 1, wherein a depth of the second trenches is greater than a depth of the first trenches.

14. The method of claim 1, wherein a depth of the second trenches is substantially the same as a depth of the first trenches.

15. The method of claim 1, wherein the step of forming the hard mask patterns comprises:
    sequentially forming a hard mask layer and a sacrificial layer on the substrate;
    patterning the sacrificial layer to form a plurality of mandrel patterns;
    forming a spacer on a sidewall of each mandrel pattern;
    removing the mandrel patterns; and
    patterning the hard mask layer by using the spacers as a mask.

16. The method of claim 15, wherein the hard mask layer comprises, form bottom to top, a first silicon oxide layer, a silicon nitride layer, and a second silicon oxide layer, and wherein the spacers comprise silicon nitride, and the sacrificial layer comprises amorphous silicon.

17. The method of claim 1, further comprising forming a bottom anti-reflection coating (BARC) layer on the filling layer before the step of forming the patterned mask layer.

18. A method of forming a shallow trench isolation structure, comprising:
   forming a plurality of hard mask patterns on a substrate;
   removing a portion of the substrate by using the hard mask patterns as a mask, so as to form a plurality of first trenches in the substrate, wherein a fin is disposed between the neighboring first trenches;
   forming a filling layer in the first trenches, wherein the filling layer is a spin-coated organic dielectric layer;
   forming a patterned mask layer on the filling layer;
   removing a portion of the filling layer and a portion of the fins by using the patterned mask layer as a mask, so as to form a plurality of second trenches in the substrate;
   forming a first insulating layer on the substrate filling in the second trenches; and
   removing the filling layer before the step of forming the first insulating layer, wherein the first insulating layer further fills in the first trenches.

* * * * *